United States Patent [19]

McInerney et al.

[11] Patent Number: 4,690,746

[45] Date of Patent: Sep. 1, 1987

[54] INTERLAYER DIELECTRIC PROCESS

[75] Inventors: Edward J. McInerney, Milpitas; E. Ronald Dornseif, Scotts Valley; Norman E. Zetterquist, Santa Cruz, all of Calif.

[73] Assignee: Genus, Inc., Mountain View, Calif.

[21] Appl. No.: 832,836

[22] Filed: Feb. 24, 1986

[51] Int. Cl.$^4$ .................. B05D 3/06; C23C 14/00
[52] U.S. Cl. .................. 204/192.32; 204/192.35; 204/192.37; 427/38
[58] Field of Search ........ 204/192 R, 192 E, 192 EC, 204/192 D; 156/643, 646, 653; 427/38, 39

[56] References Cited

U.S. PATENT DOCUMENTS

| 3,661,747 | 5/1972 | Byrnes, Jr. et al. | 204/192 EC |
| 3,941,672 | 3/1976 | Tanaka et al. | 204/192 EC |
| 3,945,902 | 3/1976 | Hawryls et al. | 204/192 EC |
| 3,983,022 | 9/1976 | Auyang et al. | 204/192 EC |
| 4,007,103 | 2/1977 | Baker et al. | 204/192 EC |
| 4,339,300 | 7/1982 | Noble | 204/192 EC X |
| 4,468,437 | 8/1984 | Patten et al. | 204/192 EC X |
| 4,599,135 | 7/1986 | Tsunekawa et al. | 427/38 X |

OTHER PUBLICATIONS

C. Y. Ting et al., "Study . . . SiO$_2$", J. Vac. Sci. Technol., vol. 15, No. 2, May/Jun. 1972, pp. 1105–1112.
"Sidewall-Tapered Oxide by Plasma-Enhanced Chemical Vapor Deposition", by Gregory C. Smith and Andrew J. Purdes; J. Electrochem. Soc. Nov. 85, vol. 132, No. 11.

Primary Examiner—John F. Niebling
Assistant Examiner—Nam X. Nguyen
Attorney, Agent, or Firm—Joseph H. Smith

[57] ABSTRACT

A method for producing a film over a topologically non-planar surface of a material which has a sputter etch rate which is higher in a direction parallel to the plane of the wafer than in a direction perpendicular to the plane of the wafer. Key steps in the process include first, depositing the material by plasma enhanced chemical vapor deposition while simultaneously sputter etching it. Then second, sputter etching the material. Using this two step process, a substantially conformal or sloped film is produced by repeating the steps consecutively until the desired thickness is obtained. The film can then be substantially planarized if desired, by an extended sputter etch to selectively remove material having a sloped surface rather than a flat surface, since the etch rate is higher parallel to the plane of the wafer than perpendicular to the wafer. If a thicker planar surface is desired, additional material can then be deposited by steps of simultaneous plasma chemical vapor deposition and sputter etch, or by consecutive steps of simultaneous plasma deposition and sputter etch followed by sputter etching.

6 Claims, 16 Drawing Figures

FIG. 7  TEMPERATURE OF TURRET 300 DEGREES C.

| STEP NUMBER | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| TIME (SECONDS) | 10 | 10 | 80 | 300 | 10 | 80 | 400 | 10 | 80 | 400 | 10 | 80 | 400 | 10 | 80 |
| PRESSURE (MILLITORR) | 70 | 70 | 70 | 30 | 70 | 70 | 30 | 70 | 70 | 30 | 70 | 70 | 30 | 70 | 70 |
| POWER (WATTS) | | | | 2500 | | 900 | 2500 | | 900 | 2500 | | 900 | 2500 | | 900 |
| GAS FLOWS (SCCM): | | | | | | | | | | | | | | | |
| SIH4 | | 50 | 50 | | | 50 | | | 50 | | | 50 | | | 50 |
| ARGON | 200 | 200 | 200 | 200 | | 200 | 200 | | 200 | 200 | | 200 | 200 | | 200 |
| N2O | 700 | 700 | 700 | | | 700 | 700 | | 700 | 700 | | 700 | 700 | | 700 |

| STEP NUMBER | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|
| TIME (SECONDS) | 400 | 10 | 160 | 800 | 10 | 80 | 4000 | 10 | 80 | 400 | 10 | 80 | | | |
| PRESSURE (MILLITORR) | 30 | 70 | 70 | 30 | 70 | 70 | 30 | 70 | 70 | 30 | 70 | 70 | | | |
| POWER (WATTS) | 2500 | | 900 | 2500 | | 900 | 2500 | | 900 | 2500 | | 900 | | | |
| GAS FLOWS (SCCM): | | | | | | | | | | | | | | | |
| SIH4 | | 50 | 50 | | | 50 | | | 50 | | | 50 | | | |
| ARGON | 200 | 200 | 200 | 200 | | 200 | 200 | | 200 | 200 | | 200 | | | |
| N2O | | 700 | 700 | | | 700 | 700 | | 700 | 700 | | 700 | | | |

FIG. 8    TEMPERATURE OF TURRET 300 DEGREES C.

| STEP NUMBER | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| TIME (SECONDS) | 10 | 110 | 300 | 10 | 110 | 400 | 10 | 110 | 400 | 10 | 110 | 400 | 10 | 110 | 400 |
| PRESSURE (MILLITORR) | 70 | 70 | 30 | 70 | 70 | 30 | 70 | 70 | 30 | 70 | 70 | 30 | 70 | 70 | 30 |
| POWER (WATTS) |  | 2500 | 2500 | 2500 | 2500 | 2500 | 2500 | 2500 | 2500 | 2500 | 2500 | 2500 | 2500 | 2500 | 2500 |
| GAS FLOWS (SCCM): |  |  |  |  |  |  |  |  |  |  |  |  |  |  |  |
| SIH4 |  | 50 |  |  | 50 |  |  | 50 |  |  | 50 |  |  | 50 |  |
| ARGON | 200 | 200 | 200 | 200 | 200 | 200 | 200 | 200 | 200 | 200 | 200 | 200 | 200 | 200 | 200 |
| N2O | 700 | 700 |  | 700 | 700 |  | 700 | 700 |  | 700 | 700 |  | 700 | 700 |  |

| STEP NUMBER | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|
| TIME (SECONDS) | 10 | 110 | 400 | 10 | 220 | 800 | 10 | 220 | 800 | 10 | 220 | 800 | 10 | 220 | 1500 |
| PRESSURE (MILLITORR) | 70 | 70 | 30 | 70 | 70 | 30 | 70 | 70 | 30 | 70 | 70 | 30 | 70 | 70 | 30 |
| POWER (WATTS) |  | 2500 | 2500 | 2500 | 2500 | 2500 | 2500 | 2500 | 2500 | 2500 | 2500 | 2500 | 2500 | 2500 | 2500 |
| GAS FLOWS (SCCM): |  |  |  |  |  |  |  |  |  |  |  |  |  |  |  |
| SIH4 |  | 50 |  |  | 50 |  |  | 50 |  |  | 50 |  |  | 50 |  |
| ARGON | 200 | 200 | 200 | 200 | 200 | 200 | 200 | 200 | 200 | 200 | 200 | 200 | 200 | 200 | 200 |
| N2O | 700 | 700 |  | 700 | 700 |  | 700 | 700 |  | 700 | 700 |  | 700 | 700 |  |

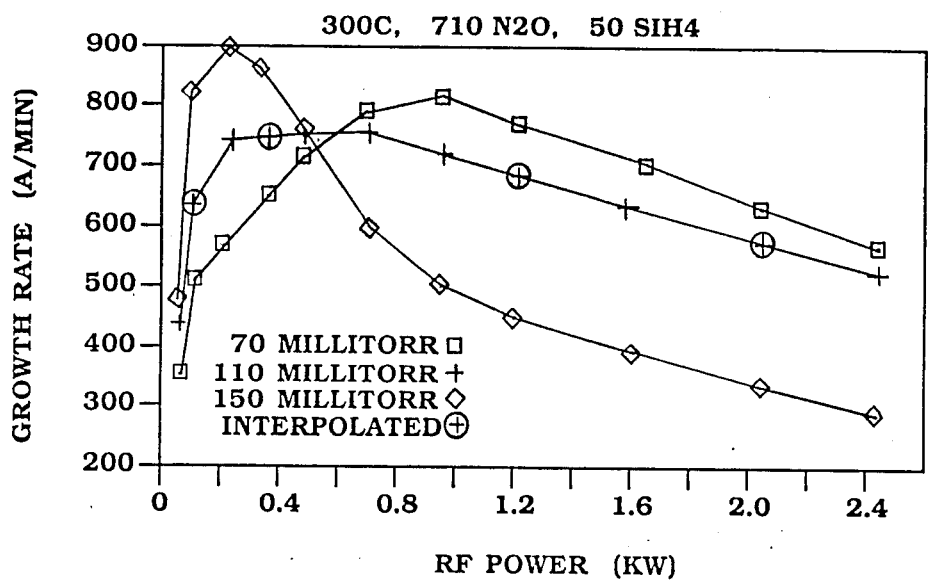
FIG. 9  Growth Rate vs RF Power
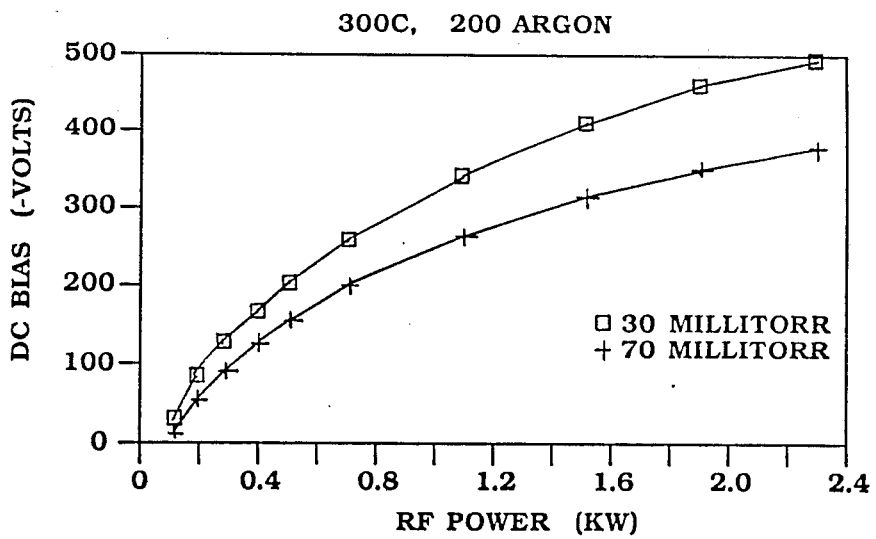
FIG. 10  DC Bias vs RF Power

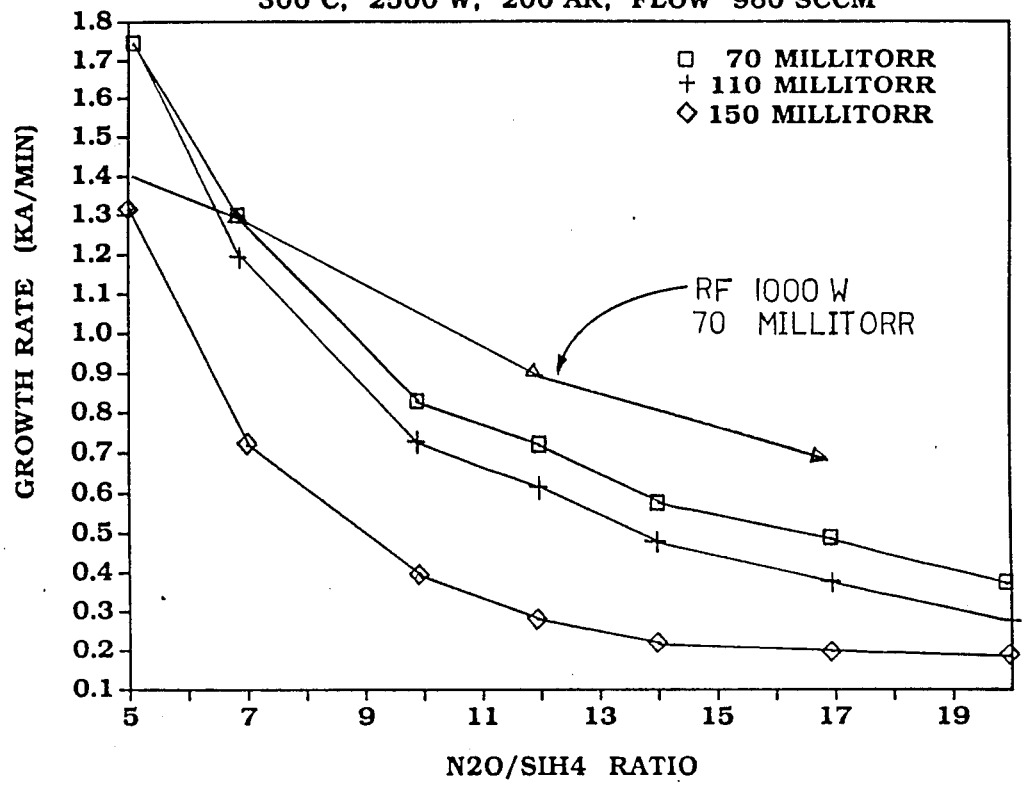
FIG. 11 Growth Rate vs N2O/SiH4 Ratio
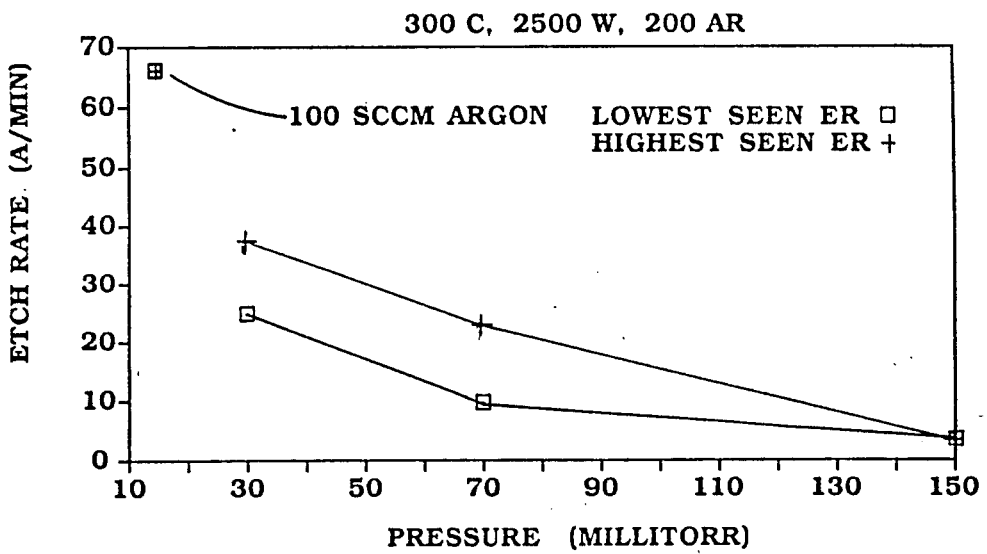
FIG. 12 Etch Rate vs Pressure (Perpendicular)

INTERLAYER DIELECTRIC PROCESS

This invention relates to plasma enhanced chemical vapor deposition (PECVD) and ion sputter etching, and particularly to combinations thereof to achieve in-situ insulating dielectric film coverage of underlying metal interconnect lines for very large scale integrated (VLSI) structures.

In the topology of deposited dielectrics, the construction of VLSI devices has become increasingly important as lateral device dimensions approach, and in some cases become smaller than, the heights of topological features. The importance of dielectric surface topology arises primarily from the need to conformally coat the dielectric layer with metal, and then to etch the metal cleanly. Typically, when using physical deposition of PECVD, the resulting step coverage shows reentrant surfaces such as illustrated in FIG. 1. This is due to shadowing which causes lower deposition rates at the corners near the bottom of a step than at the top of a step. If the deposited dielectric is then planarized using resist and etching, voids can be created where the reentrant surfaces closed on themselves during deposition. Hence, if the dielectric topography is not planarized before physical depositon of metal, the metal layers can become discontinuous on the reentrant dielectric surfaces because of shadowing. Or, if CVD is used to deposit the subsequent metal, the metal layer is conformal, thus solving the open circuit problem, but may result in shorting of adjacent etched conductors. This latter result is due to the anisotropic etch of the metalization layer because of shadowing by overhanging dielectric.

To remedy this problem, two approaches are generally used: (1) bias sputtering of quartz (see "Study of Planarized Sputter Deposited $SiO_2$", by C. Y. Ting, et al, J. Vac. Sci. Technol., 15(3), May/June 1978), and (2) plasma enhanced CVD (see "Sidewall-Tapered Oxide By Plasma Enhanced Chemical Vapor Deposition", by Gregory C. Smith, et al, J. Electrochem. Soc., No. 85, Vol. 132 No. 11). Using bias sputtered quartz, the basic mechanism relies on the fact that the sputtering removal rate on solids depends on the angle of ion incidence. Due to this anisotropy, sputter etching is performed simultaneously with the deposition of oxide to tailor the topography of the sputtered film. As a general rule, however, the topography created by such a technique is typically only partially planarized due to time constraints. Complete planarization often takes many hours.

In using plasma enhanced CVD, the approach taken is to deposit oxide using PECVD and to simultaneously sputter etch to control the topographic modifications. Again, the results provide only partial planarization as a practical matter.

SUMMARY OF THE INVENTION

In performing the mothod of the invention, the process approach uniquely combines plasma enhanced chemical vapor deposition technology with ion sputtering etching technology in a manner that has in-situ capability to achieve insulating dielectric film coverage of underlying metal interconnect lines for VLSI structures either in a conformal structure or a substantially planarized structure.

The general method applies to producing a film over a topologically non-planar surface of a material which has a sputter etch rate which is higher in a direction parallel to the plane of the wafer than in a direction perpendicular to the plane of the wafer. Key steps in the process include first, depositing the material by plasma enhanced chemical vapor deposition while simultaneously sputter etching it. Then second, sputter etching the material. Using this general two step process, a substantially conformal or sloped film can be produced by repeating the steps consecutively until the desired thickness is obtained. The film can then be substantially planarized if desired, by an extended sputter etch, since the etch rate is higher parallel to the plane of the wafer than perpendicular to the wafer. If a thicker planar surface is desired, additional material can then be deposited by a prolonged step of simultaneous plasma chemical vapor deposition and sputter etch, or by consecutive pairs of steps, where the first step is of simultaneous plasma deposition and sputter etch, which is followed by a second step of sputter etching.

BRIEF DESCRIPTION OF THE DRAWINGS

FIG. 7 is a table providing a first example of the process parameters used to practice a method of the invention.

FIG. 8 is a table providing a second example of the process parameters used to practice a method of the invention.

FIG. 9 is a graph of film growth rate as a function of RF power.

FIG. 10 is a graph of self-induced D.C. bias versus RF power during the sputter etch mode (i.e. no deposition).

FIG. 11 is a graph of film growth rate as a function of nitrous oxide to silane ratio.

FIG. 12 is a graph of sputter etch rate perpendicular to the wafer plane as a function of chamber pressure.

DETAILED DESCRIPTION OF THE INVENTION

Figure 2:
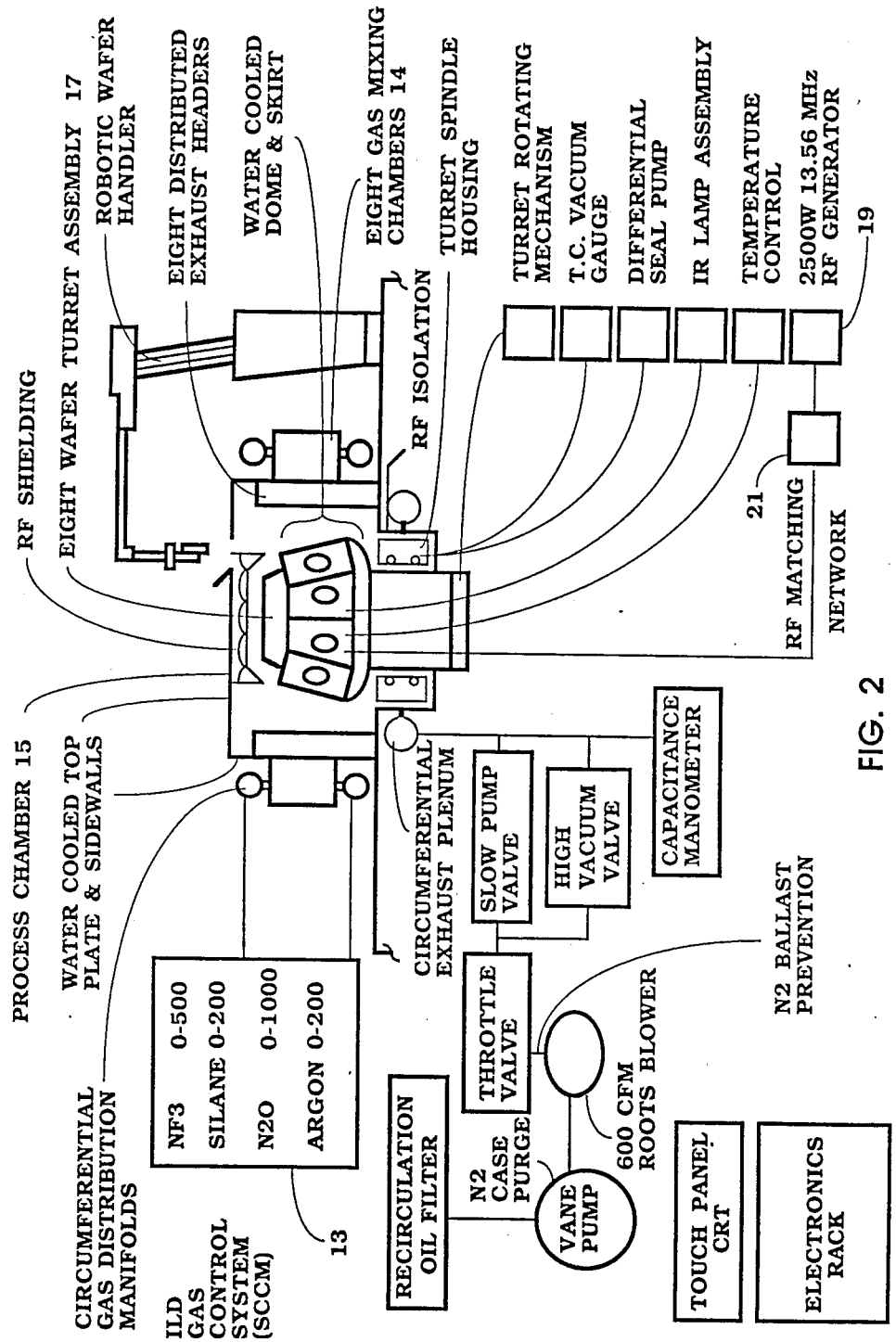
FIG. 2 shows a schematic of a cold wall deposition chamber used to practice the method of the invention.

To illustrate the method of the invention, it is best first to described the apparatus used to practice the method. Shown in FIG. 2 is a schematic of a CVD system used in this interlayer dielectric process (ILD) which is substantially similar to the CVD system described in detail in U.S. Pat. No. 4,565,157, issued Jan.

21, 1986, assigned to Genus, Inc. of Mountain View, Calif., and incorporated herein by reference. The standard system has been modified slightly to change some of the process gases, so that the total complement of process gases includes $N_2O$, Ar, $SiH_4$ and $NF_3$ under the supervision of a gas control system 13. This system is a cold wall, CVD system with plasma enhanced deposition capability with an electrically grounded vacuum process chamber 15 and an electrically isolated heated turret assembly 17 where wafers are mounted. Also, mixing chambers 14 are independently cooled. RF energy up to 2500 watts at 13.56 MH, is available from a generator 19 which is coupled to the heated turret 17. The turret also acts as an electrode, through a DC blocking capacitor and matching network 21. This geometry permits the generation of a gaseous plasma in process chamber 15 as well as a self-induced DC voltage which negatively biases the turret electrode 17 to below ground potential due to the equilibrium state of the plasma. The relatively large diameter of electrically grounded process chamber 15 (~60 cm) in comparison to the diameter of isolated turret electrode 17 (~30 cm) provides a substantial difference in the surface areas of these electrodes which in turn corresponds to a large value for the induced negative bias on the turret electrode. (For a given plasma potential, the induced negative bias increases monotonically with the ratio of the areas of these two electrodes.) This self induced negative DC bias voltage between the electrodes acts as an accelerating potential for positive ions in the plasma which causes the ions to bombard the wafer, thereby sputter etching it. Because of the capabilities of the apparatus, the etching process can be performed either simultaneously as materials are deposited, known hereinafter as the simultaneous dep/etch mode, or simply as an independent sputter etch without deposition, known hereinafter as the etch mode. In practice, the system can be used in three distinct process approaches to achieve an interlayer dielectric film, depending on the type of film desired, ie. depending on the selected degree of conformal or planar coverage desired over the underlying topology.

Process 1

Figure 1:
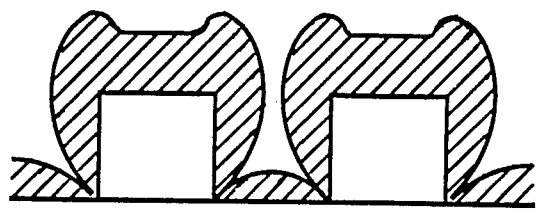
FIG. 1 shows a typical problem of reentrant surfaces for step coverage resulting from prior art techniques.
Figure 3:
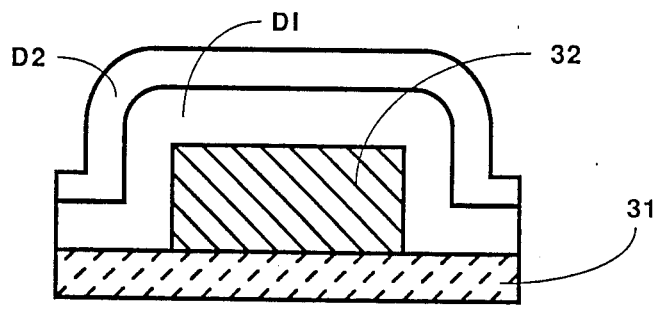
FIG. 3 illustrates the conformal surface over an interconnect obtained using simultaneous plasma enhanced chemical vapor deposition and sputter etching.

In this process, the system is used entirely in the simultaneous dep/etch mode to achieve a conformal film such as that illustrated in FIG. 3, and corresponds substantially to the prior art methods for dielectric interlayers as described previously in the Background of the Invention. The plasma enhanced CVD of dielectric material and the sputter etching away for the deposited material occur at the same time, but with a net accumulation. Depending on the process parameters selected, various degrees of conformal or sloped step coverage can be achieved with the film basically replicating the underlying topology. This approach typically cannot be utilized to achieve planar film coverage. FIG. 3 shows the results of two sequential steps of a simultaneous PECVD/sputter etch over a substrate 31 having a metal layer 32 thereon. The deposited layers are D1 and D2.

Process 2

Figure 4:
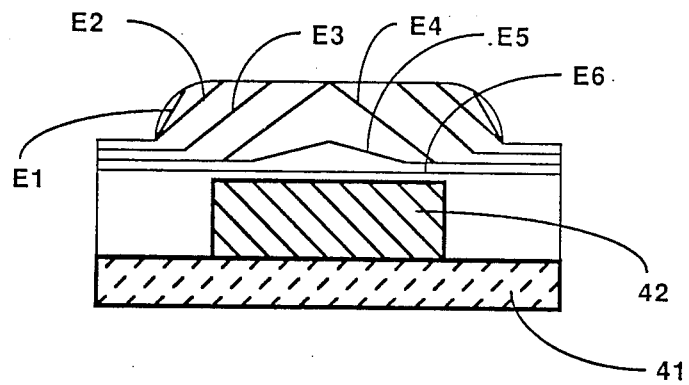
FIG. 4 illustrates different degrees of conformality or planarity which can be achieved using a method of the invention whereby a series of steps of simultaneous plasma enhanced chemical vapor deposition and sputter etching are followed by sputter etching, the differences in planarity being due to different times for the final sputter etching.

In this process one or more steps of dep/etch (simultaneous deposition and sputter etch) are followed by a single sputter etch step. During the etch step, no reactant gases are flowing and therefore no film deposition occurs. The process parameters for each of these steps can be selected to achieve a particular set of film results. A high degree of sloped coverage including full planarization is achievable with this approach, although with less than optimal film properties or machine throughput performance. The results of this process are illustrated in FIG. 4, which shows a substrate 41 having a metal layer 42 thereon. The sequential steps of dep/etch result in a thick layer of dielectric D over the substrate and metal layer. Etching is then used to etch back the dielectric layer. Etchback lines E1–E6 illustrate the results of etching for different lengths of time, the time to reach etchback line E6 being larger than the time to reach the etchback line E1.

Process 3

Figure 5:
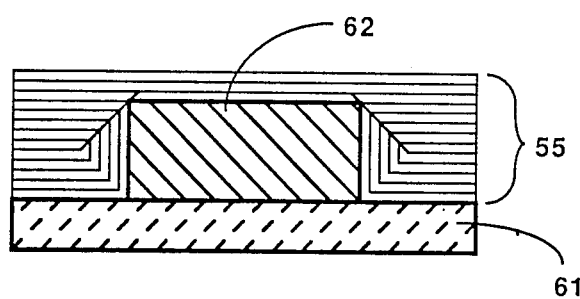
FIG. 5 illustrates a substantially planarized surface which can be obtained by a method of the invention whereby a series of repeated cycles are used where each cycle is made up of simultaneous plasma enhanced chemical vapor deposition plus sputter etching followed by sputter etching alone.

This process is one of repeated, sequential operation. By repeating shorter duration versions of the single dep/etch step plus etch step grouping of Process 2, two or more times with process parameters optimized for each cycle, both film properties and machine performance can be optimized concurrently. This process is preferred when sloped coverage or a high degree of planar coverage is required at minimal loss of machine throughput. FIG. 5 shows the results of the process over a substrate 61 having a metallic layer 62 thereon. The repeated cycles of dep/etch plus etch results in a layered structure 55 of dielectric which can be made substantially planar.

Figure 6:
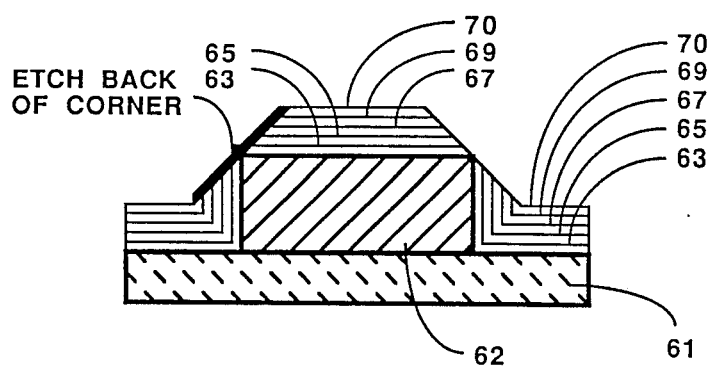
FIGS. 6a–6d show the results of the method of the invention illustrated in FIG. 5 at different stages during the process.
Figure 6:
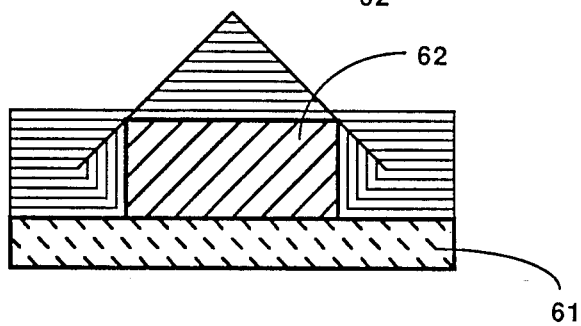
Figure 6:
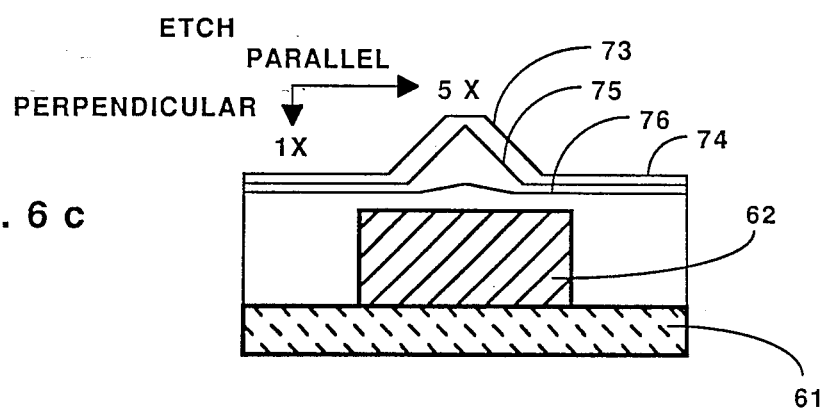
Figure 6:
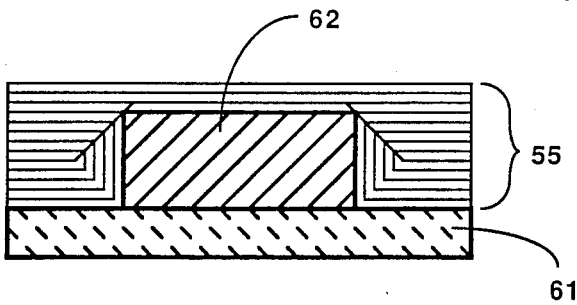

The results of this third process are illustrated in more detail in FIGS. 6a–6d. In FIG. 6a, the substrate 61 with metal interconnect layer 62 is shown with successive layers 63 through 70 deposited thereon. The layers are produced by successive steps of simultaneous dep/etch with each such dep/etch followed by an etch. Each etch performed alone, ie. without simultaneous deposition, selectively removes the film corner produced by the simultaneous dep/etch, so that repeated cycles provide the structure of FIG. 6a which has a sloped coverage. FIG. 6b illustrates the results of further repeated cycles of the steps dep/etch plus etch which has been stopped after a predetermined thickness has been reached which covers the metal interconnect layer 62. After achieving the desired thickness in FIG. 6b, the duration of the final etch step is extended to achieve the degree of planarity desired. In the situation as illustrated in FIG. 6c, which is typical for the process, etch rates parallel to the plane of the wafer are as much as five times faster than etch rates perpendicular to the plane of the wafer so that sloped surfaces 73 are generally etched away faster than flat surfaces 74. Also, depending on the process parameters chosen, this selectively can range from 3 to 15 times. Surfaces 75 and 76 illustrate the results of successively longer final etch times to achieve planarization. After the degree of planarization desired is achieved, additional steps of dep/etch plus etch are performed to obtain the desired film depth over the entire substrate 61 and interconnect 62 such as shown in FIG. 6d.

Examples

Since Processes 1 and 2 are included in Process 3, only Process 3 will be described in detail by way of example. The first example chosen corresponds to deposition of $SiO_2$ on a silicon substrate having a metal interconnect thereon (typically aluminum) with a step height of 5000 A and a width of 8400 A. As illustrated in the process sheet of FIG. 7, the process begins at steps 1 and 2 with an initial process setup to let the chamber equilibrate and to stabilize gas pressures. This is followed by a sequential grouping made up of a simultaneous dep/etch using $SiH_4$, Ar, and $N_2o$ at step 3 to put down SiO$_2$ on the substrate surface; an etch of the SiO$_2$ at step 4; and a repeat at step 5 of the setup stabilization used in step 2. (The particular process parameters are also given in FIG. 7.)

This first sequential grouping at steps 3 through 5 are then repeated 4 times in steps 6–17 but for a time of 400 seconds at each etch step rather than 300 seconds as in the first sequential grouping, so that by step 17, approximately 5100 A of SiO$_2$ have been deposited on the substrate and the interconnect. (The shorter time of 300 seconds for the first etch was used to ensure that the first etch did not penetrate the first deposited layer.) At steps 18 and 19, the repeated sequence of steps of dep-/etch plus etch are performed for further extended times, twice the previous times, in order to obtain thicker layers of material a slightly faster average deposition rate and a singular process in the sense of there being fewer steps. Such extended times are generally avoided during the first several cycles, since it is typically important to lay down relatively thin films at first to avoid having keyhole-type voids in the deposited film which can be difficult to correct by later depositions. After process stabilization at step 20, a standard dep/etch is performed followed by an extended etch for 4000 seconds at step 22 in order to planarize the rather angular surface produced by the previous steps. Process stabilization is again performed at step 23, and a standard dep/etch plus etch sequence is performed at steps 24–26 to increase the thickness of the planarized SiO$_2$ film. Finally at step 27, a dep/etch cap is deposited over the surface in order to obtain some additional thickness and a clean oxide surface on top of the interconnect. At this point the surface is substantially planar, and has a thickness over the interconnect of about 3500 A with a maximum deviation from planarity of less than 15%. (similar to contour E5-E6 in FIG. 4), i.e. the maximum deviation above the mean height of the deposited layer is less than 15%.

A second example is illustrated by FIG. 8, which is a process sheet for producing a planarized film over a substrate having an aluminum interconnect with a one micron height and a one micron width. In this example, a single step (Step 1) is used for chamber stabilization. The process begins as before with an initial dep/etch plus etch followed by stabilization (Steps 2-4), with a reduced time of 300 seconds for the etch, but with a constant RF power of 2500 watts for each of the steps. (This power level was used throughout since some experiments showed somewhat improved film quality for depositions at this high power.) This first triad of steps is followed as before with a sequence of triads of identical steps, except for an increase in time to 400 seconds for the simultaneous dep/etch in each one. This sequence of triads is continued until a thickness of SiO$_2$ of about 6500 A is obtained at step 19, this sequence of thin layers being built up to avoid keyhole-type voids as before. From step 20–29, the times for the dep/etch and etch steps are doubled to put down the material at a higher rate. Then at step 30 a final etch is performed to substantially planarize the surface. With this exemplary process, the surface over the interconnect has a thickness of about 4000 A, with a maximum deviation from planarity of less than 15%.

For situations where wider linewidth interconnects are used, the final time required to achieve planarity appears to increase substantially. For example, for a four micron wide interconnect which is one micron in height, the final etch at step 30 to achieve comparable planarity would be increased by 100 minutes.

Those skilled in the art will appreciate that the relative times of the various steps, the process gas pressures and flow rates, and the RF power are all variables which can be manipulated within the constraints of the apparatus to optimize film quality and machine throughput. To that end, several experiments were run which led to the selection of the process parameters of FIGS. 7 and 8 which were described earlier. For example, FIG. 9 shows the relationship between film growth rate and RF power for a simultaneous dep/etch step. For a substantial range of the RF power, the lowest chamber pressure yeilded the highest growth rate. With the ILD apparatus described earlier, the lowest chamber pressure which could be consistently maintained at the high gas flow rates for the dep/etch was 70 mT. Also, the maximum growth rate at a chamber of 70 mT occurs at about 900 watts of RF power as was used in the first example above.

FIG. 10 is a graph of DC bias versus RF power for the etch step. This graph indicates that one should use the lowest chamber pressure achievable with the maximum RF power, which for the ILD chamber was 30 mT with the Argon at a flow rate 200 sccm and an RF power of 2500 watts.

FIG. 11 shows the growth rate of the dep/etch step as a function of the ratio of N$_2$O to SiH$_4$ for different chamber pressures. Again the highest growth rates occur at the lowest pressure. Here, the graph also indicates that the growth is faster as the ratio of N$_2$O to SiH$_4$ becomes more stoichiometric, ie. a low ratio. However, other experiments dictated a ratio of 14 to 1 based on the film quality obtained.

Figure 13:
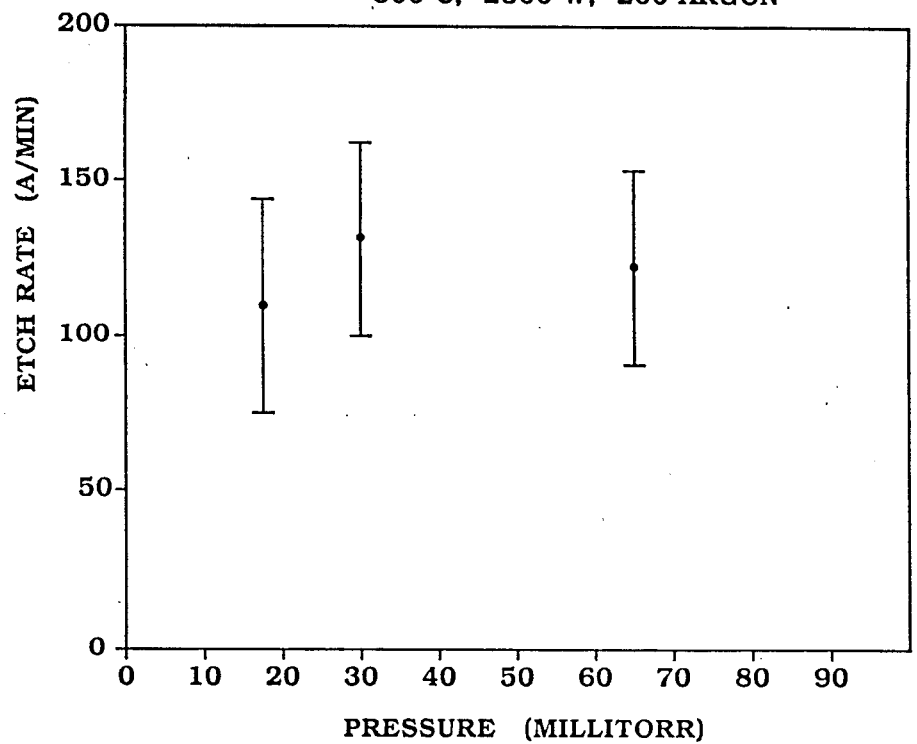
FIG. 13 is a graph of sputter etch rate parallel to the wafer plane as a function of chamber pressure.

FIG. 12 illustrates the perpendicular Rf etch rate as a function of chamber pressure, and FIG. 13 illustrates the parallel RF etch rate as a function of chamber pressure. FIG. 12 indicates that a lower chamber pressure increases the perpendicular etch rate and FIG. 13 indicates that the maximum parallel etch rate occurs at about 30 mT. Hence, 30 mT was chosen as the operating chamber pressure for the etch step.

We claim:

1. A method of producing a film over a wafer that has a topologically non-planar surface of a material having an RF sputter etch rate which is higher in a direction parallel to the plane of the wafer than perpendicular to the plane of the wafer, comprising the steps of:
   (1) depositing said material by plasma enhanced chemical vapor deposition while simultaneously sputter etching said material as it is deposited;
   (2) after step 1, sputter etching said material; and
   (3) repeating steps 1 and 2 as a pair N times, where N is an integer and N ≧ 1.

2. The method of claim 1 wherein after steps 1 and 2 are repeated N times, the material is further sputter etched until a substantially planar surface of the material is obtained.

3. The method of claim 2 wherein after the further sputter etch, step (1) of claim 1 is repeated M times, where M is an integer greater than zero.

4. The method of claim 3 wherein step (2) of claim 1 is repeated every time step (1) is repeated for said M times.

5. The method of claim 4 wherein said material is a dielectric.

6. The method of claim 4 wherein the material is SiO$_2$.

* * * * *